United States Patent
Sze (12) United States Patent (10) Patent No.: US 7,776,676 B2
Sze (45) Date of Patent: Aug. 17, 2010

(54) FABRICATING METHOD OF COMPLEMENTARY METAL-OXIDE-SEMICONDUCTOR (CMOS) IMAGE SENSOR INCLUDING P TYPE GATE STRUCTURE

(75) Inventor: Jhy-Jyi Sze, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/954,194

(22) Filed: Dec. 11, 2007

(65) Prior Publication Data

US 2008/0113477 A1 May 15, 2008

Related U.S. Application Data

(62) Division of application No. 11/550,415, filed on Oct. 18, 2006.

(51) Int. Cl.
*H01L 21/8238* (2006.01)

(52) U.S. Cl. .......................................... 438/200; 438/48

(58) Field of Classification Search .................... 438/48, 438/199, 200; 257/225–227, 407
See application file for complete search history.

(56) References Cited

U.S. PATENT DOCUMENTS

| 4,559,694 | A  | * | 12/1985 | Yoh et al. ..................... 438/275 |
| 6,815,281 | B1 | * | 11/2004 | Inoue et al. .................. 438/200 |
| 2004/0099907 | A1 | * | 5/2004 | Morimoto et al. ........... 257/341 |
| 2006/0231875 | A1 |   | 10/2006 | Patrick et al. |

* cited by examiner

*Primary Examiner*—Ori Nadav
(74) *Attorney, Agent, or Firm*—Jianq Chyun IP Office (57) ABSTRACT

A method of fabricating a complementary metal-oxide-semiconductor image sensor is provided. First, a substrate having a photo sensitive region and a transistor device region is provided. A p type well in the substrate of the transistor device region is formed. A dielectric layer and an un-doped polysilicon layer on the substrate are sequentially formed. A n type polysilicon layer on a first portion of the transistor device region and a p type polysilicon layer on the photo sensitive region and on a second portion of the transistor device region are formed. The dielectric layer, the n type polysilicon layer and the p type polysilicon layer are patterned to form a plurality of n type gate structures and a p type gate structure on the p type well of the transistor device region. A photo sensitive diode is formed in the substrate of the photo sensitive region.

17 Claims, 7 Drawing Sheets

FABRICATING METHOD OF COMPLEMENTARY METAL-OXIDE-SEMICONDUCTOR (CMOS) IMAGE SENSOR INCLUDING P TYPE GATE STRUCTURE

CROSS-REFERENCE TO RELATED APPLICATION

This application is a divisional of an application Ser. No. 11/550,415, filed on Oct. 18, 2006, now pending. The entirety of each of the above-mentioned patent applications is hereby incorporated by reference herein and made a part of this specification.

BACKGROUND OF THE INVENTION

1. Field of the Invention

The present invention relates to an image sensor and a fabricating method thereof. More particularly, the present invention relates to a complementary metal oxide semiconductor (CMOS) image sensor and a fabricating method thereof.

2. Description of Related Art

The process of forming a complementary metal oxide semiconductor (CMOS) image sensor is compatible to the process of forming a complementary metal oxide semiconductor (CMOS) transistor. Consequently, CMOS image sensors and CMOS transistors can be fabricated with other peripheral circuits on the same chip. Thus, the power consumption and the fabricating cost of image sensors can be significantly reduced. In recent years, the CMOS image sensor has replaced the charge-coupled device (CCD) in the lower level application and has become popular day by day.

The CMOS image sensor is composed of a photo sensitive diode and a plurality of transistors. The photo sensitive diode is formed of a p-n junction including an n type doped region and the p type substrate. The transistors are n type transistors having an n type gate (n-poly NMOS). Currently, the CMOS image sensor includes two configurations of 3-T and 4-T. The 3-T configuration means the CMOS image sensor includes a reset transistor (Rx), a source coupling transistor (Dx), a select transistor (Sx) and a photo sensitive diode, while the 4-T configuration means the CMOS image sensor has a transfer transistor (Tx), a reset transistor, a source coupling transistor, a select transistor and a photo sensitive diode. Recently, the CMOS image sensor usually has a disadvantage of current leakage. Generally, the photo sensitive diode and the transistors of the CMOS image sensor would generate current leakage. The problem of current leakage as above mentioned would cause large dark current in the CMOS image sensor, such that the read noise is increased and the image quality is deteriorated, and thus the device performance is decreased.

In particular, for the 4-T CMOS image sensor, the dark current in the CMOS image sensor occurs due to the current leakage of the transfer transistor. Therefore, how to reduce the current leakage of the image sensor becomes an important development topic.

SUMMARY OF THE INVENTION

The objective of the present invention is to provide a CMOS image sensor and a fabricating method thereof capable of reducing the current leakage and avoiding the dark current so as to improve the image quality and device performance.

The present invention provides a method of fabricating a CMOS image sensor. A substrate having a photo sensitive region and a transistor device region is provided. Next, a p type well is formed in the substrate of the transistor device region. A dielectric layer and an un-doped polysilicon layer are sequentially formed on the substrate. Thereafter, a first mask layer is formed to cover the un-doped polysilicon layer in the photo sensitive region and a portion of the transistor device region. A first ion implantation process is performed to implant an n type impurity into the exposed un-doped polysilicon layer so as to form an n type polysilicon layer, and then the first mask layer is removed. Next, a second mask layer is formed to cover the n type polysilicon layer. A second ion implantation process is performed to implant a p type impurity into the exposed un-doped polysilicon layer so as to form a p type polysilicon layer, and then the second mask layer is removed. Thereafter, the dielectric layer, the n type polysilicon layer and the p type polysilicon layer are patterned to form a plurality of n type gate structures and a p type gate structure on the p type well of the transistor device region. Then, a photo sensitive diode is formed in the substrate of the photo sensitive region.

According to an embodiment of the present invention, the n type gate structures are the gate structures of three of a transfer transistor, a reset transistor, a source coupling transistor and a select transistor, and the p type gate structure is the gate structure of the other one of the transistors.

According to an embodiment of the present invention, the n type gate structures are the gate structures of two of a reset transistor, a source coupling transistor and a select transistor, and the p type gate structure is the gate structure of the other one of the transistors.

According to an embodiment of the present invention, the n type impurity is phosphorous (P) or arsenic (As).

According to an embodiment of the present invention, the concentration of the n type impurity is between $1 \times 10^{14}$ and $5 \times 10^{15}$ ions/cm$^2$.

According to an embodiment of the present invention, the p type impurity is boron (B) or boron difluoride (BF$_2$).

According to an embodiment of the present invention, the concentration of the p type impurity is between $1 \times 10^{13}$ and $5 \times 10^{15}$ ions/cm$^2$.

According to an embodiment of the present invention, the photo sensitive diode is formed by doping process.

The present invention also provides a method of fabricating a CMOS image sensor. A substrate having a photo sensitive region and a transistor device region is provided. Next, a p type well is formed in the substrate of the transistor device region. A dielectric layer and an un-doped polysilicon layer are sequentially formed on the substrate. Next, a first ion implantation process is performed to implant an n type impurity into the un-doped polysilicon layer so as to form an n type polysilicon layer. Thereafter, a mask layer is formed to expose the un-doped polysilicon layer of the photo sensitive region and a portion of the transistor device region. A second ion implantation process is performed to implant a p type impurity so as to make the exposed n type polysilicon layer transferring into a p type polysilicon layer. Thereafter, the dielectric layer, the n type polysilicon layer and the p type polysilicon layer are patterned to form a plurality of n type gate structures and a p type gate structure on the p type well of the transistor device region. Then, a photo sensitive diode is formed in the substrate of the photo sensitive region.

According to an embodiment of the present invention, the n type gate structures are the gate structures of three of a transfer transistor, a reset transistor, a source coupling transistor and a select transistor, and the p type gate structure is the gate structure of the other one of the transistors.

According to an embodiment of the present invention, the n type gate structures are the gate structures of two of a reset transistor, a source coupling transistor and a select transistor, and the p type gate structure is the gate structure of the other one of the transistors.

According to an embodiment of the present invention, the n type impurity is phosphorous (P) or arsenic (As).

According to an embodiment of the present invention, the concentration of the n type impurity is between $1 \times 10^{14}$ and $5 \times 10^{15}$ ions/cm$^2$.

According to an embodiment of the present invention, the p type impurity is boron (B) or boron difluoride (BF$_2$).

According to an embodiment of the present invention, the concentration of the p type impurity is between $1 \times 10^{13}$ and $5 \times 10^{15}$ ions/cm$^2$.

According to an embodiment of the present invention, the photo sensitive diode is formed by doping process.

The present invention also provides a CMOS image sensor comprising a substrate, a photo sensitive diode, a p type gate structure and a plurality of n type gate structures. The substrate has a photo sensitive region and a transistor device region. The photo sensitive diode is disposed in the substrate of the photo sensitive region. The p type gate structure is disposed on the substrate of the transistor device region. The n type gate structures are disposed on the substerate of the transistor device region.

According to an embodiment of the present invention, the n type gate structures are the gate structures of three of a transfer transistor, a reset transistor, a source coupling transistor and a select transistor, and the p type gate structure is the gate structure of the other one of the transistors.

According to an embodiment of the present invention, the n type gate structures are the gate structures of two of a reset transistor, a source coupling transistor and a select transistor, and the p type gate structure is the gate structure of the other one of the transistors.

According to an embodiment of the present invention, the photo sensitive diode is a p-n junction.

The present invention also provides a CMOS image sensor comprising a substrate, a photo sensitive diode, a p type gate structure and a plurality of n type transistors. The substrate has a photo sensitive region and a transistor device region. The photo sensitive diode is disposed in the substrate of the photo sensitive region. The n type transistors are disposed on the substerate of the transistor device region, wherein the n type transistors comprise a p type gate structure and a plurality of n type gate structures.

According to an embodiment of the present invention, the n type gate structures are the gate structures of three of a transfer transistor, a reset transistor, a source coupling transistor and a select transistor, and the p type gate structure is the gate structure of the other one of the transistors.

According to an embodiment of the present invention, the n type gate structures are the gate structures of two of a reset transistor, a source coupling transistor and a select transistor, and the p type gate structure is the gate structure of the other one of the transistors.

According to an embodiment of the present invention, the photo sensitive diode is a p-n junction.

In the CMOS image sensor of the present invention, the p type gate structure (p-poly) is used instead of the conventional n type gate structure (n-poly) for the n type transistor, such that the transistor current leakage can be reduced, and the dark current leading to the noise increasing, image quality deterioration and the device performance reduction in the CMOS image sensor can be avoided.

It is to be understood that both the foregoing general description and the following detailed description are exemplary, and are intended to provide further explanation of the invention as claimed.

DESCRIPTION OF EMBODIMENTS

The present invention is adapted to the 3-T or 4-T CMOS image sensor, but it is not limited herein. The present invention can also applied to other CMOS image sensors having a plurality of transistors.

Figure 1:
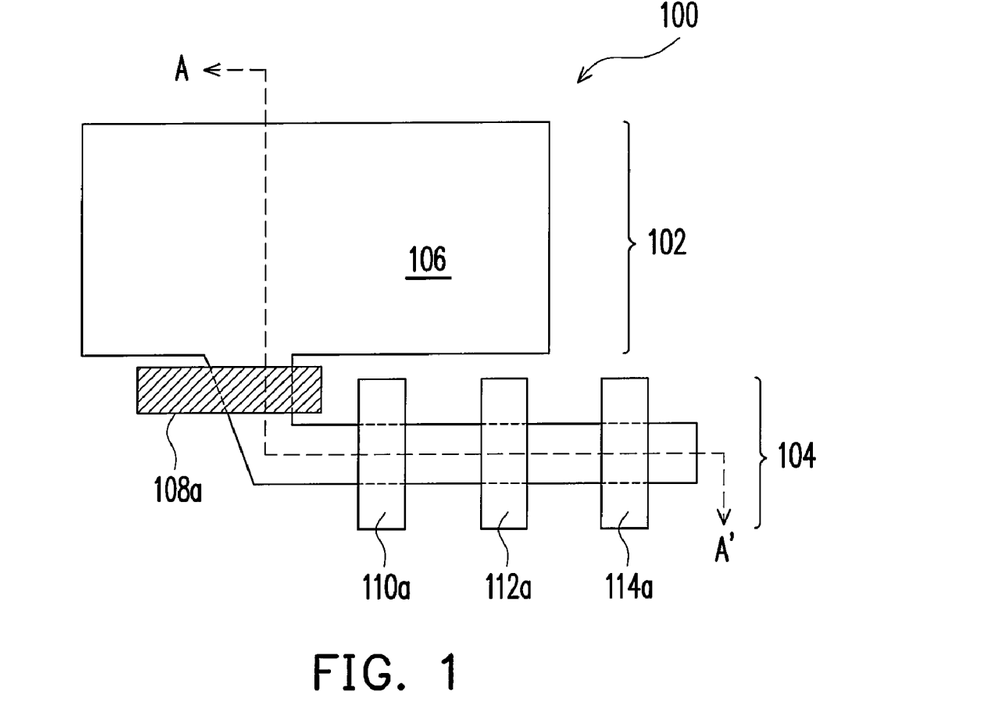
FIG. 1 is a top view showing a CMOS image sensor according to an embodiment of the present invention.
Figure 2:
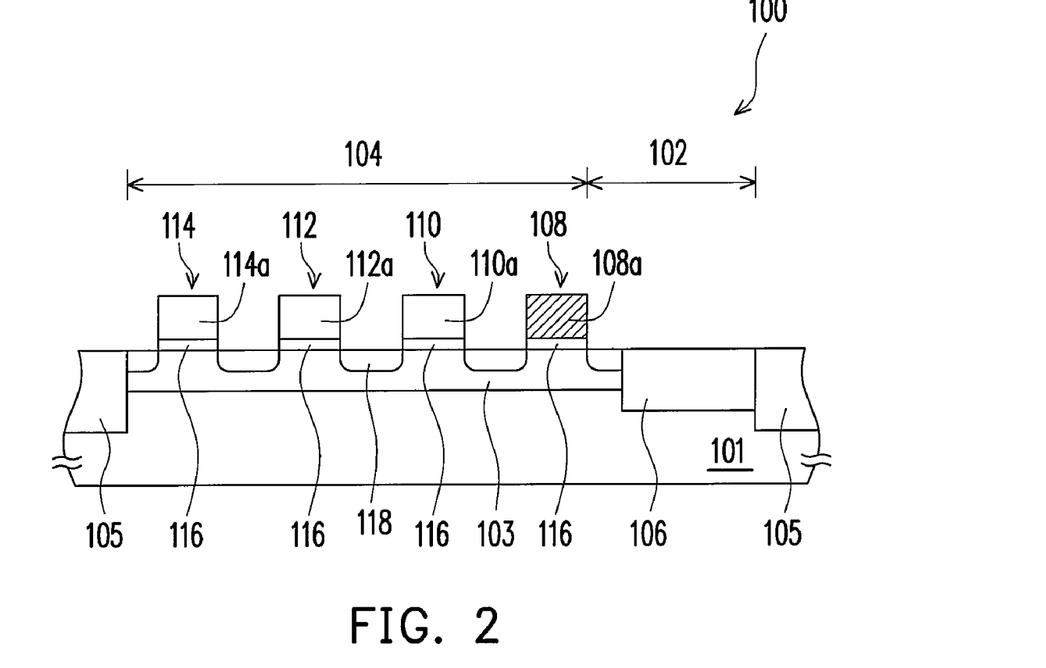
FIG. 2 is a cross-sectional view of FIG. 1 along the line A-A'.

FIG. 1 is a top view showing a CMOS image sensor according to an embodiment of the present invention. FIG. 2 is a cross-sectional view of FIG. 1 along the line A-A'.

Please refer to FIGS. 1 and 2, the 4-T CMOS image sensor 100 comprises a substrate 101, a photo sensitive diode 106, a p type gate structure 108 and a plurality of n type gate structures 110, 112, 114. The substrate 101 is, for example, a silicon substrate or other semiconductor substrate. The substrate 101 has an isolation structure 105 therein so as to define a photo sensitive region 102 and a transistor device region 104. The isolation structure 105 is, for example, a shallow trench isolation (STI) or other isolation structure. In addition, a p type well 103 is further disposed in the substrate 101 of the transistor device region 104, and a plurality of n type transistors (NMOS) are disposed on the p type well 103 which will be described subsequently.

The photo sensitive diode 106 is disposed in the p type well 103 and the substrate 101 of the photo sensitive region 102. The photo sensitive diode 106 is a p-n junction which has a function of receiving light and converting light energy into electric energy. The photo sensitive diode 106 is formed of the p type substrate 101 and an n type doped region (not shown) in the photo sensitive region 102.

The p type gate structure 108 is disposed on the p type well 103 of the transistor device region 104. The p type gate structure 108 is formed of a p type polysilicon layer 108a and a dielectric layer 116, wherein the p type polysilicon layer 108a is used as a p type gate (p-poly) while and dielectric layer 116 is used as a gate oxide layer. In the embodiment, the p type gate structure 108 is the gate structure of a transfer transistor (Tx) as an example for illustration.

The n type gate structures 110, 112, 114 are disposed on the p type well 103 of the transistor device region 104. Each of the n type gate structures 110, 112, 114 is formed of a n type polysilicon layer 110a, 112a, 114a and a dielectric layer 116, wherein the n type polysilicon layer 110a, 112a, 114a is used as a n type gate (n-poly) while and dielectric layer 116 is used as a gate oxide layer. The n type gate structures 110, 112, 114 are respectively the gate structures of a reset transistor (Rx), a source coupling transistor (Dx) and a select transistor (Sx).

Moreover, the CMOS image sensor 100 further comprises n type sources and drains 118 disposed in the p type well 103 beside then type gate structures 110, 112, 114 and the p type gate structure 108. Therefore, the transfer transistor formed of p-poly NMOS, and the reset transistor, the source coupling transistor and the select transistor formed of n-poly NMOS are completed.

The present invention does not limit the positions of the transistors to the description of the foregoing embodiment. The arrangement of the transistors can be adjusted according to the circuit design or process requirement.

According to another embodiment, in the CMOS image sensor 100, the p type gate structure 108 can be the gate structure of one of the reset transistor, the source coupling transistor and the select transistor, and the n type gate structures 110, 112, 114 are the gate structures of the other three of the transistors.

According to another embodiment, in a 3-T CMOS image sensor, the gate structure of one of the reset transistor, source coupling transistor and select transistor is the p type gate structure, and the gate structures of the other two of the transistors are the n type gate structures.

In the foregoing embodiment, the transfer transistor of the 4-T CMOS image sensor is the p-poly NMOS. Because the work function different of the p-poly NMOS is larger than that of the n-poly NMOS, when the transistor is turned off during the device operation, the holes are accumulated at the interface between substrate and the gate oxide layer of the transfer transistor, such that the current leakage of the transfer transistor can be reduced. On the other hand, when the transistor is turned on, a buried channel is formed underneath the transfer transistor of p-poly NMOS, such that the charge transfer barrier can be reduced, and thus the current leakage can be reduced.

The methods of fabricating the CMOS image sensor according to two embodiments of the present invention are described as follows. FIG. 3A to FIG. 3F are cross-sectional views showing the method of fabricating a CMOS image sensor in accordance with an embodiment of the present invention.

Figure 3A:
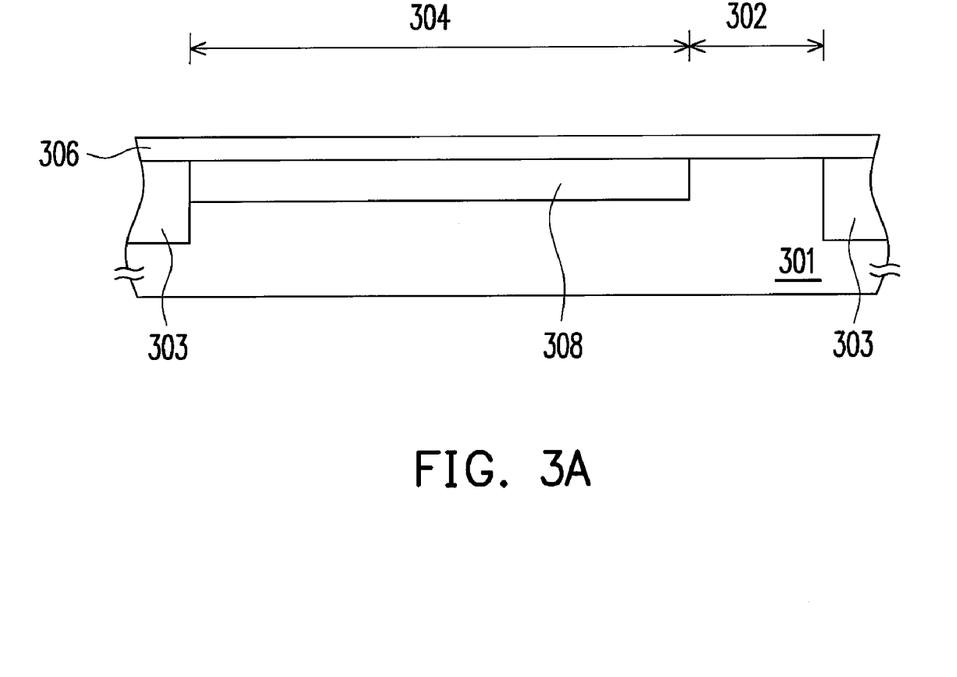
FIG. 3A to FIG. 3F are cross-sectional views showing the method of fabricating a CMOS image sensor in accordance with an embodiment of the present invention.

First, as shown in FIG. 3A, a substrate 301 is provided. The substrate 301 is, for example, a silicon substrate or other semiconductor substrate. An isolation structure 303 is formed in the substrate 301 to define a photo sensitive region 302 and a transistor device region 304. The isolation structure 303 is, for example, a shallow trench isolation (STI) or other isolation structure.

Next, a p type well 308 is formed in the substrate 301 of the transistor device region 304. The p type well 308 is formed by, for example, forming a photo resist layer (not shown) on the substrate of the photo sensitive region 302; performing an ion implantation process to implant boron (B) or other suitable p type impurity into the substrate 301 of the transistor device region 304; and then removing the photo resist layer. According to another embodiment, the p type well can be formed in the whole substrate 301. In an embodiment, before forming the p type well 308, a sacrificial oxide layer 306 can be further formed on the substrate 301 to prevent the surface of the substrate 301 from being contaminated and damaging of ion implantation for forming the well.

Figure 3B:
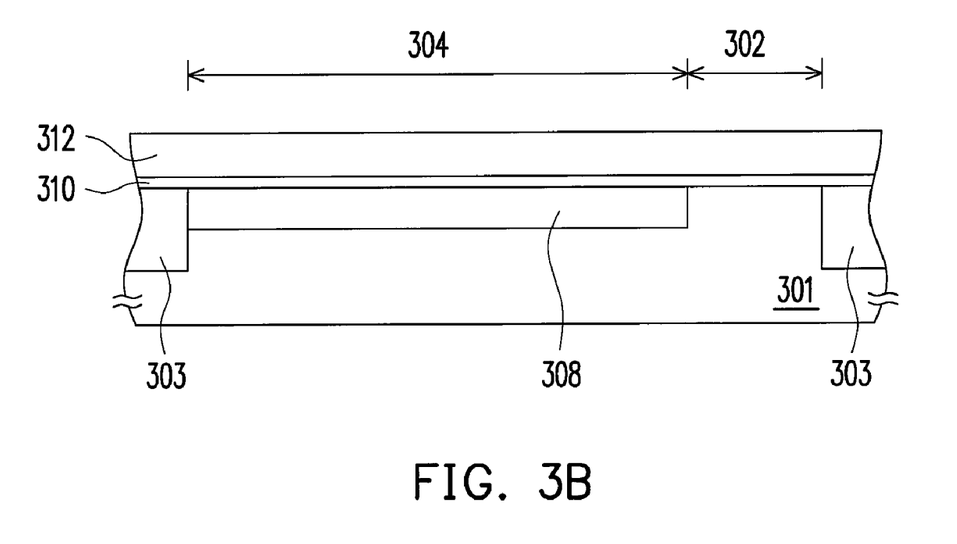

Thereafter, as shown in FIG. 3B, the sacrificial oxide layer 306 is removed after the p type well 308 is formed. Then, a dielectric layer 310 is formed on the substrate 301, wherein a material of the dielectric layer 310 is silicon oxide, for example. Next, an un-doped polysilicon layer 312 is formed on the dielectric layer 310. The un-doped polysilicon layer 312 is formed by chemical vapor deposition (CVD), for example.

Figure 3C:
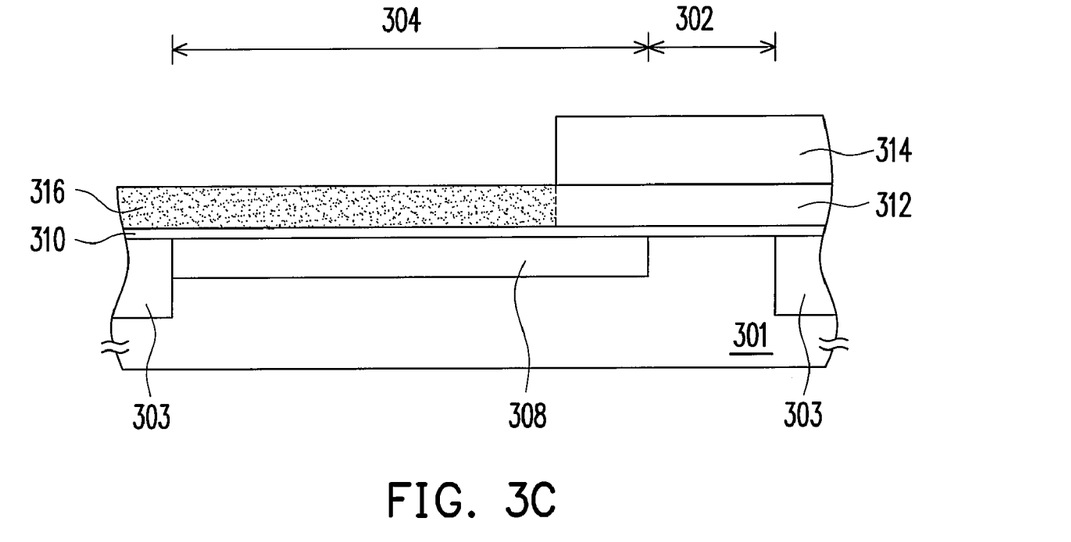

Please refer to FIG. 3C, a mask layer 314 is formed to cover the un-doped polysilicon layer 312 of the photo sensitive region 302 and a portion of the transistor device region 304 (the region for forming a transfer transistor). The mask layer 314 can be a photo resist layer, for example. Next, an ion implantation process is performed to implant an n type impurity into the exposed un-doped polysilicon layer 312 so as to form an n type polysilicon layer 316. The n type impurity is phosphorous (P) or arsenic (As), for example, and the concentration of the n type impurity is between $1\times10^{14}$ and $5\times10^{15}$ ions/cm$^2$.

Figure 3D:
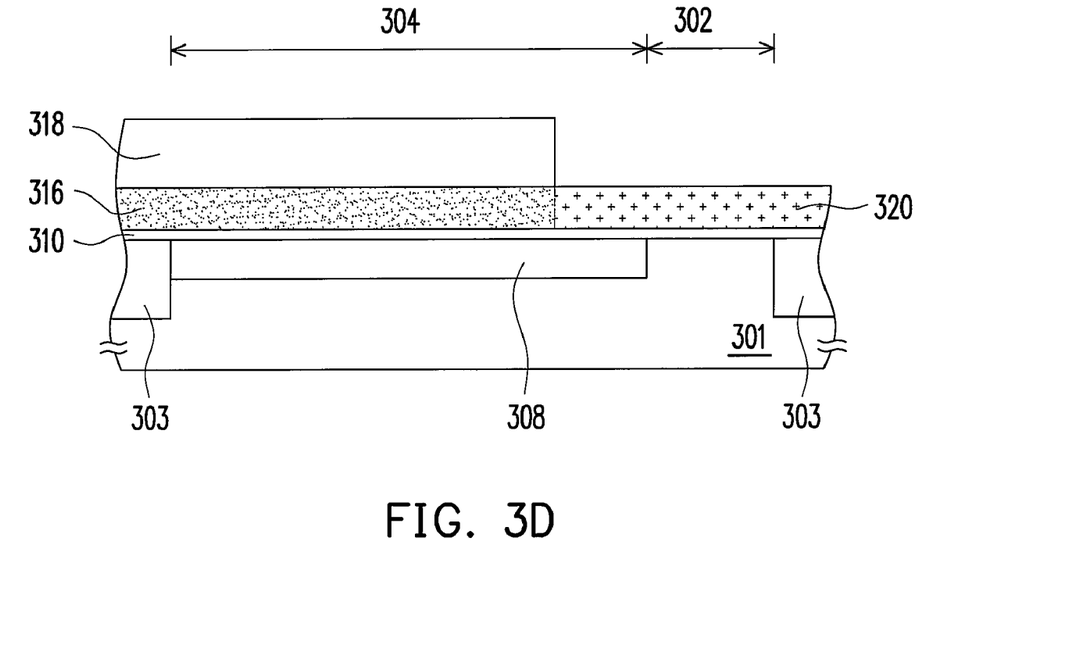

Please refer to FIG. 3D, the mask layer 314 is removed after the n type polysilicon layer 316 is formed. Then, a mask layer 318 is formed on the n type polysilicon layer 316, and the mask layer 318 is a photo resist layer, for example. Next, an ion implantation process is performed to implant a p type impurity into the exposed un-doped polysilicon layer 312 so as to form a p type polysilicon layer 320. The p type impurity is boron (B) or boron diflouride (BF$_2$), for example, and the concentration of the p type impurity is between $1\times10^{13}$ and $5\times10^{15}$ ions/cm$^2$.

Figure 3E:
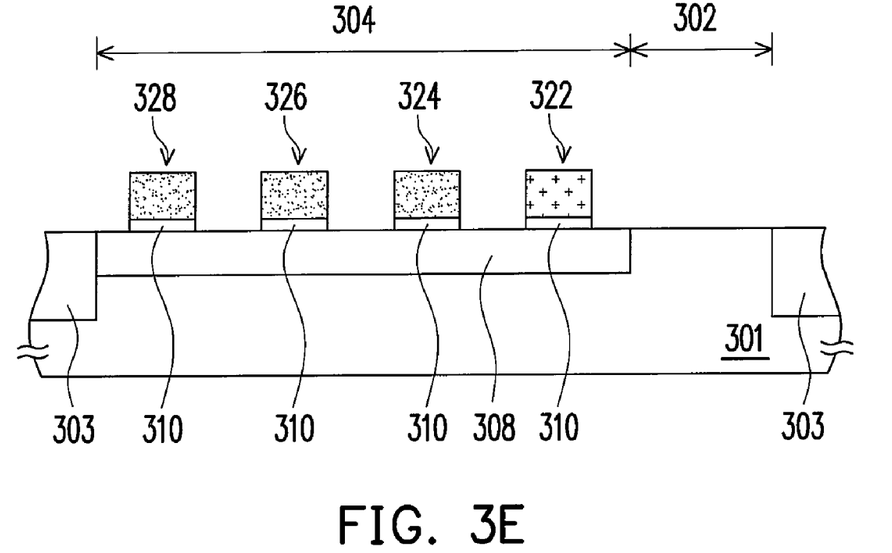

Please refer to FIG. 3E, the mask layer 318 is removed after the p type polysilicon layer 320 is formed. Thereafter, the dielectric layer 310, the n type polysilicon layer 316 and the p type polysilicon layer 320 are patterned to form a plurality of n type gate structures 324, 326, 328 and a p type gate structure 322 on the p type well 308 of the transistor device region 304. The method for patterning the dielectric layer 310, the n type polysilicon layer 316 and the p type polysilicon layer 320 is, for example, performing a photolithography and etching process. In particular, the p type gate structure 322 is used as the gate structure of the transfer transistor, while the n type gate structures 324, 326, 328 are used as the gate structures of the reset transistor, the source coupling transistor and the select transistor.

Figure 3F:
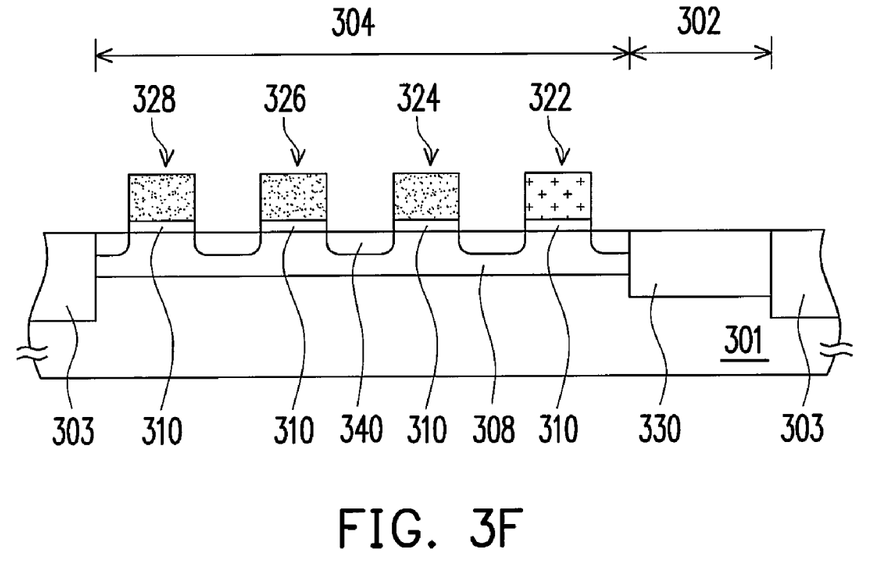

Please refer to FIG. 3F, a photo sensitive diode 330 is formed in the p type well 308 and the substrate 301 of the photo sensitive region 302. The photo sensitive diode 330 is a p-n junction, and is formed by performing a doping process to dope an n type impurity into the p type well 308.

After forming the photo sensitive diode 330, n type sources and drains 340 are further formed in the p type well 308. The method for forming the sources and drains is, for example, using an ion implantation process to implant phosphorous or other suitable n type impurity into the p type well 308.

FIG. 4A to FIG. 4F are cross-sectional views showing the method of fabricating a CMOS image sensor in accordance with another embodiment of the present invention.

Figure 4A:
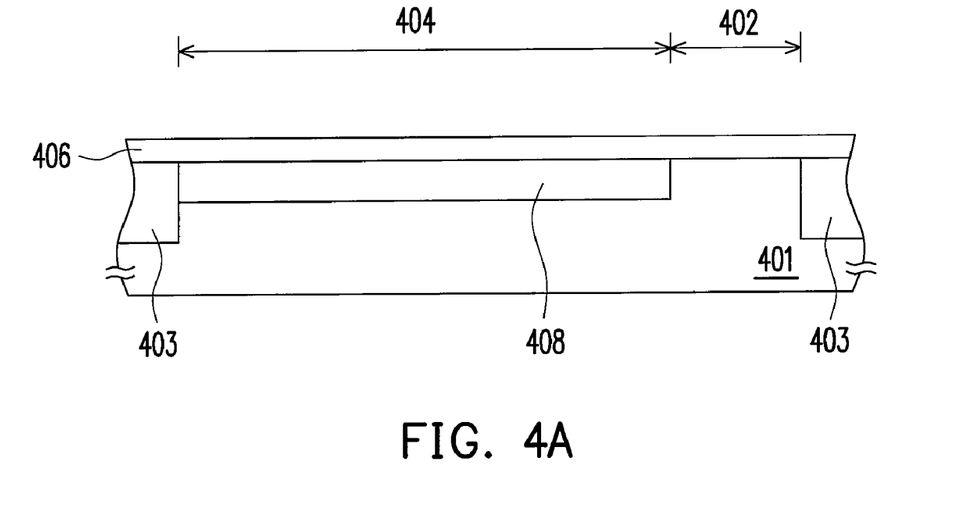
FIG. 4A to FIG. 4F are cross-sectional views showing the method of fabricating a CMOS image sensor in accordance with another embodiment of the present invention.

First, as shown in FIG. 4A, a substrate 401 is provided. The substrate 401 is, for example, a silicon substrate or other semiconductor substrate. An isolation structure 401 is formed in the substrate 403 to define a photo sensitive region 402 and a transistor device region 404. The isolation structure 403 is, for example, a shallow trench isolation (STI) or other isolation structure.

Next, a p type well 408 is formed in the substrate 401 of the transistor device region 404. The p type well 408 is formed by, for example, forming a photo resist layer (not shown) on the substrate of the photo sensitive region 402; performing an ion implantation process to implant boron (B) or other suitable p type impurity into the substrate 401 of the transistor device region 404; and then removing the photo sensitive layer. According to another embodiment, the p type well 408 can be formed in the whole substrate 401. In an embodiment, before forming the p type well 408, a sacrificial oxide layer 406 can be further formed on the substrate 401 to prevent the surface of the substrate 401 from being contaminated and damaging of ion implantation for forming the well.

Figure 4B:
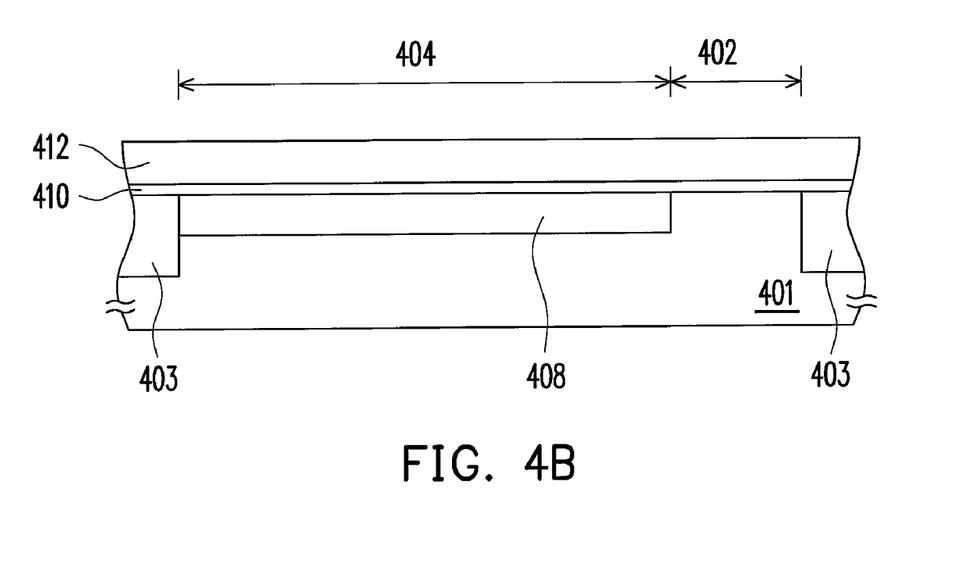

Thereafter, as shown in FIG. 4B, the sacrificial oxide layer 406 is removed after the p type well 408 is formed. Then, a dielectric layer 410 is formed on the substrate 401, wherein a material of the dielectric layer 410 is silicon oxide, for example. Next, an un-doped polysilicon layer 412 is formed on the dielectric layer 410. The un-doped polysilicon layer 412 is formed by chemical vapor deposition, for example.

Figure 4C:
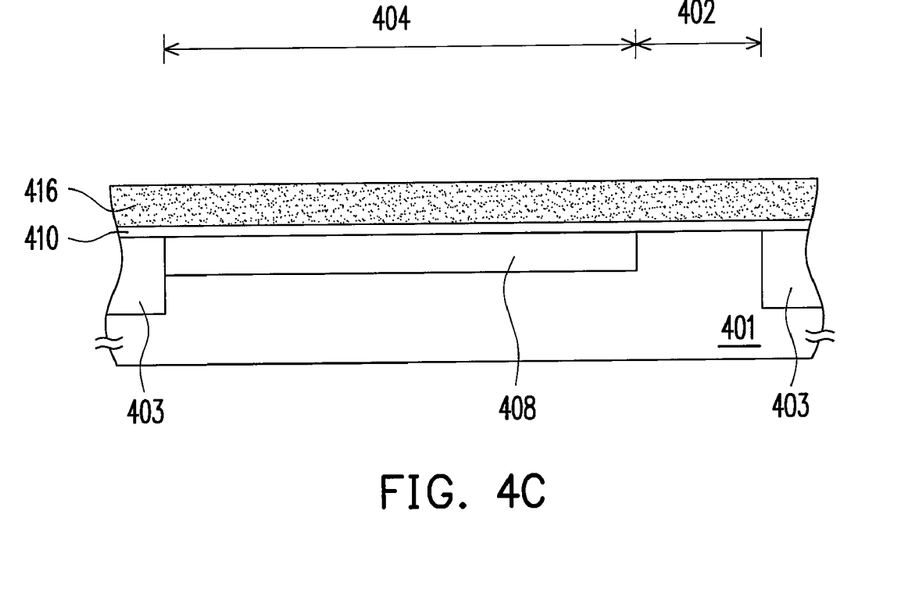

Next, please refer to FIG. 4C, an ion implantation process is performed to implant an n type impurity into the un-doped polysilicon layer 412 so as to form an n type polysilicon layer 416. The n type impurity is phosphorous (P) or arsenic (As), for example, and the concentration of the n type impurity is between $1 \times 10^{14}$ and $5 \times 10^{15}$ ions/cm$^2$.

Figure 4D:
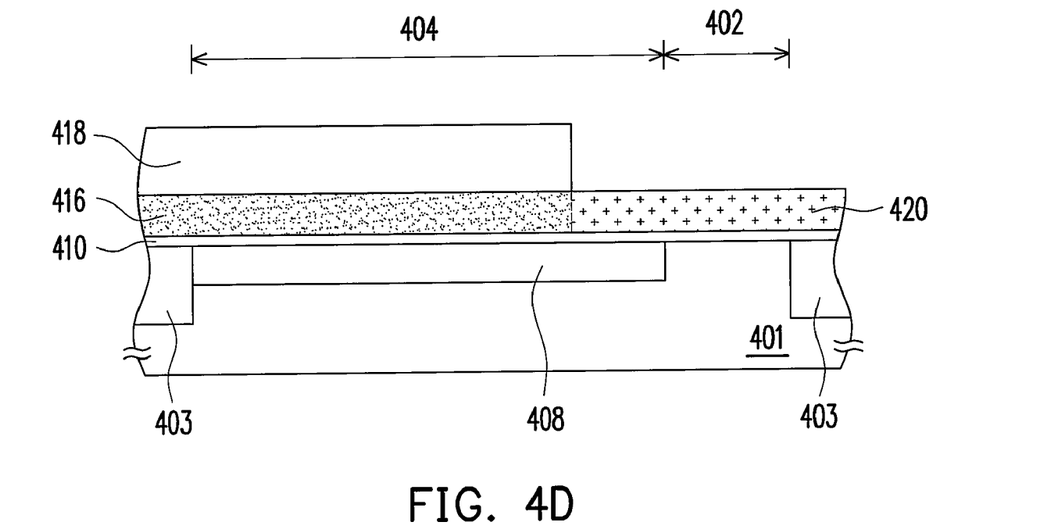

Please refer to FIG. 4D, a mask layer 418 is formed to expose the n type polysilicon layer 416 of the photo sensitive region 402 and a portion of the transistor device region 404 (the region for forming a transfer transistor). The mask layer 318 is, for example, a photo resist layer. After that, an ion implantation process is performed to implant a p type impurity so as to make the exposed n type polysilicon layer 416 transferring into a p type polysilicon layer 420. The p type impurity is boron (B) or boron difluoride (BF$_2$), for example, and the concentration of the p type impurity is between $1 \times 10^{13}$ and $5 \times 10^{15}$ ions/cm$^2$.

Figure 4E:
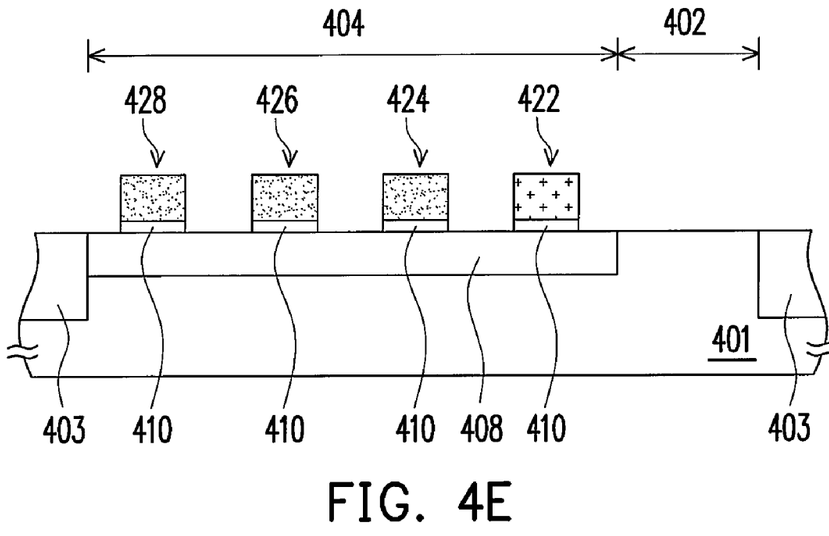

Please refer to FIG. 4E, after the p type polysilicon layer 420 is formed, the mask layer 418 is removed. Thereafter, the dielectric layer 410, the n type polysilicon layer 416 and the p type polysilicon layer 420 are patterned to form a plurality of n type gate structures 424, 426, 428 and a p type gate structure 422 on the p type well 408 of the transistor device region 404. The method for patterning the dielectric layer 410, the n type polysilicon layer 416 and the p type polysilicon layer 420 is, for example, performing a photolithography and etching process. In particular, the p type gate structure 422 is used as the gate structure of the transfer transistor, while the n type gate structures 424, 426, 428 are used as the gate structures of the reset transistor, the source coupling transistor and the select transistor.

Figure 4F:
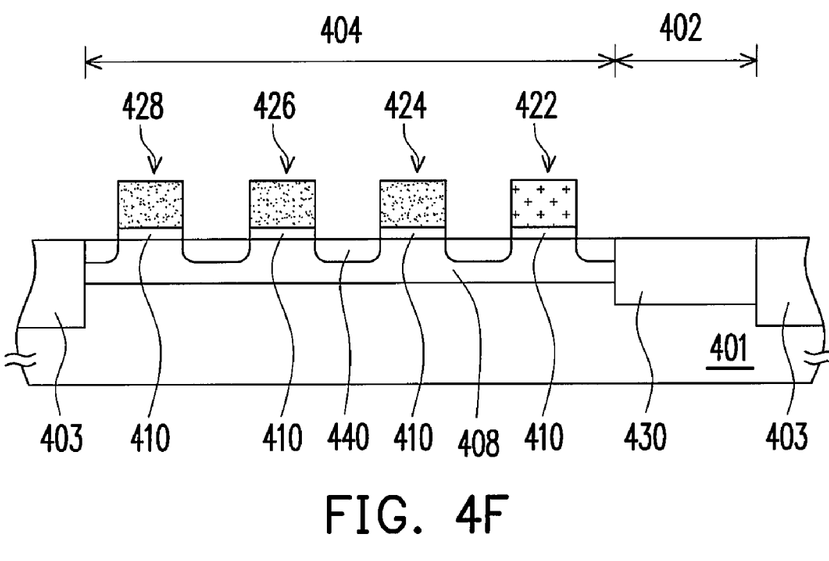

Please refer to FIG. 4F, a photo sensitive diode 430 is formed in the p type well 408 and the substrate 401 of the photo sensitive region 402. The photo sensitive diode 430 is a p-n junction, and is formed by performing a doping process to dope an n type impurity into the p type well 408.

Similarly, after forming the photo sensitive diode 430, n type sources and drains 440 are further formed in the p type well 408. The method for forming the sources and drains is, for example, using an ion implantation process to implant phosphorous or other suitable n type impurity into the p type well 408.

According to the above descriptions, the n type gate structure of the n type transistor in a CMOS image sensor is replaced by the p type gate structure. Because the work function different of the p-poly NMOS is larger than that of the n-poly NMOS, when the transistor is turned off during the device operation, the holes are accumulated at the interface between substrate and the gate oxide layer of the p-poly NMOS, such that the current leakage of the transistor can be reduced. On the other hand, when the transistor is turned on, a buried channel is formed underneath the transistor of p-poly NMOS, such that the charge transfer barrier can be reduced, and thus the current leakage can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a complementary metal-oxide-semiconductor (CMOS) image sensor, comprising:

providing a substrate having a photo sensitive region and a transistor device region of the CMOS image sensor;

forming a p type well in the substrate of the transistor device region;

sequentially forming a dielectric layer and an un-doped polysilicon layer on the substrate;

doping the un-doped polysilicon layer to form an n type polysilicon layer on a first portion of the transistor device region and a p type polysilicon layer on the photo sensitive region and on a second portion of the transistor device region;

after the step of doping the un-doped polysilicon layer, patterning the dielectric layer, the n type polysilicon layer and the p type polysilicon layer to form a plurality of n type gate structures and a p type gate structure on the p type well of the transistor device region of the CMOS image sensor, wherein the p type gate structure is the gate structure of one of a transfer transistor, a reset transistor, a source coupling transistor and a select transistor; and forming a photo sensitive diode in the substrate of the photo sensitive region.

2. The method of fabricating a complementary metal-oxide-semiconductor image sensor according to claim 1, wherein the n type gate structures are the gate structures of three of a transfer transistor, a reset transistor, a source coupling transistor and a select transistor, and the p type gate structure is the gate structure of the other one of the transistors.

3. The method of fabricating a complementary metal-oxide-semiconductor image sensor according to claim 1, wherein the n type gate structures are the gate structures of two of a reset transistor, a source coupling transistor and a select transistor, and the p type gate structure is the gate structure of the other one of the transistors.

4. The method of fabricating a complementary metal-oxide-semiconductor image sensor according to claim 1, wherein the method for forming the photo sensitive diode comprises performing a doping process.

5. The method of fabricating a complementary metal-oxide-semiconductor image sensor according to claim 1, wherein the step of forming the n type polysilicon layer on the first portion of the transistor device region and the p type polysilicon layer on the photo sensitive region and on the second portion of the transistor device region comprises:

performing a first ion implantation process to implant an n type impurity into the un-doped polysilicon layer so as to form the n type polysilicon layer;

forming a mask layer to expose the n type polysilicon layer of the photo sensitive region and the second portion of the transistor device region;

performing a second ion implantation process to implant a p type impurity so as to make the exposed n type polysilicon layer transferring into the p type polysilicon layer; and removing the mask layer.

6. The method of fabricating a complementary metal-oxide-semiconductor image sensor according to claim 5, wherein the n type gate structures are the gate structures of three of a transfer transistor, a reset transistor, a source coupling transistor and a select transistor, and the p type gate structure is the gate structure of the other one of the transistors.

7. The method of fabricating a complementary metal-oxide-semiconductor image sensor according to claim 5, wherein the n type gate structures are the gate structures of two of a reset transistor, a source coupling transistor and a select transistor, and the p type gate structure is the gate structure of the other one of the transistors.

8. The method of fabricating a complementary metal-oxide-semiconductor image sensor according to claim 5, wherein the n type impurity comprises phosphorous (P) or arsenic (As).

9. The method of fabricating a complementary metal-oxide-semiconductor image sensor according to claim 5, wherein the concentration of the n type impurity is between $1\times10^{14}$ and $5\times10^{15}$ ions/cm2.

10. The method of fabricating a complementary metal-oxide-semiconductor image sensor according to claim 5, wherein the p type impurity comprises boron (P) or boron difluoride (BF2).

11. The method of fabricating a complementary metal-oxide-semiconductor image sensor according to claim 5, wherein the concentration of the p type impurity is between $1\times10^{13}$ and $5\times10^{15}$ ions/cm2.

12. The method of fabricating a complementary metal-oxide-semiconductor image sensor according to claim 5, wherein the method for forming the photo sensitive diode comprises performing a doping process.

13. The method of fabricating a complementary metal-oxide-semiconductor image sensor according to claim 1, wherein the step of forming the n type polysilicon layer on the first portion of the transistor device region and the p type polysilicon layer on the photo sensitive region and on the second portion of the transistor device region comprises:

forming a first mask layer to cover the un-doped polysilicon layer of the photo sensitive region and the second portion of the transistor device region;

performing a first ion implantation process to implant an n type impurity into the exposed un-doped polysilicon layer so as to form the n type polysilicon layer;

removing the first mask layer;

forming a second mask layer to cover the n type polysilicon layer;

performing a second ion implantation process to implant a p type impurity into the exposed un-doped polysilicon layer so as to form the p type polysilicon layer; and removing the second mask layer.

14. The method of fabricating a complementary metal-oxide-semiconductor image sensor according to claim 13, wherein the n type impurity comprises phosphorous (P) or arsenic (As).

15. The method of fabricating a complementary metal-oxide-semiconductor image sensor according to claim 13, wherein the concentration of the n type impurity is between $1\times10^{14}$ and $5\times10^{15}$ ions/cm2.

16. The method of fabricating a complementary metal-oxide-semiconductor image sensor according to claim 13, wherein the p type impurity comprises boron (P) or boron difluoride (BF2).

17. The method of fabricating a complementary metal-oxide-semiconductor image sensor according to claim 13, wherein the concentration of the p type impurity is between $1\times10^{13}$ and $5\times10^{15}$ ions/cm2.

* * * * *